(12) United States Patent
Fastow

(10) Patent No.: US 6,198,664 B1
(45) Date of Patent: Mar. 6, 2001

(54) APDE SCHEME FOR FLASH MEMORY APPLICATION

(75) Inventor: Richard Fastow, Cupertino, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/495,215

(22) Filed: Jan. 31, 2000

Related U.S. Application Data

(60) Provisional application No. 60/168,601, filed on Dec. 1, 1999.

(51) Int. Cl.$^7$ ..................................................... G11C 11/00

(52) U.S. Cl. ................................ 365/185.29; 365/185.22; 365/185.33

(58) Field of Search ............................... 365/218, 185.22, 365/185.29, 185.33

(56) References Cited

U.S. PATENT DOCUMENTS 6,118,705 * 9/2000 Gupta et al. ..................... 365/185.33

* cited by examiner

Primary Examiner—Terrell W. Fears
(74) Attorney, Agent, or Firm—H. Donald Nelson

(57) ABSTRACT

A method for erasing a flash EEPROM device that includes a plurality of memory cells. The plurality of memory cells is erase verified and an erase pulse is applied to the memory cells if there are undererased memory cells and the memory cells are again erase verified. This cycle repeats until all cells verify as erased and a flag is set to NO. The plurality of memory cells is overerase verified and an overerase correction pulse is applied to the bitline to which the overerased memory cell is attached and the flag is set to YES. This cycle repeats until all cells verify as not being overerased. If it is determined after the overerase verification step that the flag is set to YES, the plurality of memory cells is again erase verified and the procedure repeats. If it is determined after the overerase verification step that the flag is set to NO, the erase procedure is considered finished.

3 Claims, 3 Drawing Sheets

US 6,198,664 B1

APDE SCHEME FOR FLASH MEMORY APPLICATION

This application claims the benefit of Provisional Application 60/168,601 filed Dec. 1, 1999.

BACKGROUND OF THE INVENTION

1. Field of the Invention

This invention relates generally to the art of microelectronic integrated circuits. More specifically, this invention relates to the art of erasing microelectronic flash Electrically Erasable Programmable Read-Only Memory (EEPROM) devices. Even more specifically, this invention relates to a method of erasing microelectronic flash Electrically Erasable Programmable Read-Only Memory devices that minimizes the number of APD pulses during erase.

2. Discussion of the Related Art

A microelectronic flash or block erase Electrically Erasable Programmable Read-Only Memory (Flash EEPROM) device includes an array of cells that can be independently programmed and read. The size of each cell and thereby the memory device are made small by omitting transistors known as select transistors that enable the cells to be erased independently. As a result, all of the cells must be erased together as a block.

A flash memory of this type includes individual Metal-Oxide-Semiconductor (MOS) field effect transistor memory cells, each of which includes a source, a drain, a floating gate and a control gate to which various voltages are applied to program the cell with a binary 1 or 0, to erase all of the cells as a block, to read the cell, to verify that the cell is erased or to verify that the cell is not overerased.

The memory cells are connected in an array of rows and columns, with the control gates of the cells in a row being connected to a respective wordline and the drains of the cells in a column being connected to a respective bitline. The sources of all the cells are connected together. This arrangement is known as a NOR memory configuration.

A cell is programmed by applying a voltage, typically 9 volts to the control gate, applying a voltage of approximately 5 volts to the drain and grounding the source causing hot electrons to be injected from a drain depletion region into the floating gate. Upon removal of the respective programming voltages, the injected electrons are trapped in the floating gate creating a negative charge therein that increases the threshold voltage of the cell to a value in excess of approximately 4 volts.

A cell is read by applying typically 5 volts to the wordline to which the control gate of the cell is connected, applying 1 volt to the bitline to which the drain of the cell is connected, grounding the source, and sensing the bitline current. If the cell is programmed and the threshold voltage is relatively high (4 volts), the bitline current will be zero or at least relatively low. If the cell is not programmed or erased, the threshold voltage will be relatively low (2 volts), the control gate voltage will enhance the channel, and the bitline current will be relatively high.

A cell can be erased in several ways. In one arrangement, applying a relatively high voltage, typically 12 volts, to the source, grounding the control gate and allowing the drain to float erases a cell. These applied voltages cause the electrons that were injected into the floating gate during programming to undergo Fowler-Nordheim tunneling from the floating gate through the thin tunnel oxide layer to the source. In another arrangement, applying a negative voltage on the order of −10 volts to the control gate, applying 5 volts to the source and allowing the drain to float also erases a cell. A further method of erasing a cell is by applying 5V to the P-well and −10V to the control gate while allowing the source/drain to float.

A problem with the conventional flash EEPROM cell arrangement is that due to manufacturing tolerances, some cells become over-erased before other cells are sufficiently erased. The floating gates of the over-erased cells are depleted of electrons and become positively charged. The over-erased cells function as depletion mode transistors that cannot be turned off by normal operating voltages applied to their control gates. The cells functioning as depletion mode transistors introduce leakage current during subsequent program and read operations.

More specifically, during program and read operations only one wordline connected to the control gates of a row of cells is held high at a time, while the other wordlines are grounded. A positive voltage is applied to the drains of all of the cells and if the threshold voltage of an unselected cell is zero or negative, the leakage current will flow through the source, channel and drain of the cell.

The undesirable effect of the leakage current from the over-erased cells is as follows. In a typical flash EEPROM, the drains of a large number of memory transistor cells, for example 512 transistor cells are connected to each bitline. If a substantial number of cells on the bitline are drawing background leakage current, the total leakage current on the bitline can exceed the cell read current. This makes it impossible to read the state of any cell on the bitline and therefore renders the memory inoperative.

Because the background leakage current of a cell varies as a function of threshold voltage, the lower (more negative) the threshold voltage the higher the leakage current. It is therefore desirable to prevent cells from being over-erased and reduce the threshold voltage distribution to as low a range as possible, with ideally all cells having the same threshold voltage after erase on the order of 2 volts.

It is known in the art to reduce the threshold voltage distribution by performing an over-erase correction operation, which reprograms the most over-erased cells to a higher threshold voltage. An over-erase correction operation of this type is generally known as Automatic Programming Disturb (APD).

An APD method referred to as Automatic Programming Disturb Erase (APDE) is disclosed in U.S. Pat. No. 5,642, 311, entitled "OVERERASE CORRECTION FOR FLASH MEMORY WHICH LIMITS OVERERASE AND PREVENTS ERASE VERIFY ERRORS," issued Jun. 24, 1997 to Lee Cleveland. This patent is assigned to the same assignee as the present invention and is incorporated herein by reference in its entirety. The method includes sensing for over-erased cells and applying programming pulses thereto, which bring their threshold voltages back up to acceptable values.

Following application of an erase pulse, under-erase correction is first performed on a cell-by-cell basis by rows. The cell in the first row and column position is addressed and erase verified by applying 4 volts to the control gate (wordline), 1 volt to the drain (bitline), grounding the source, and using sense amplifiers to sense the bitline current to determine if the threshold voltage of the cell is above a value of, for example, 2 volts. If the cell is under-erased, indicated by a threshold voltage above 2 volts, the bitline current will be low. In this case, an erase pulse is applied to all of the cells, and the first cell is erase verified again.

In the method described in U.S. Pat. No. 5,642,311, after application of each erase pulse and prior to a subsequent erase verify operation, over-erase correction is performed on all the cells in the memory. Over-erase verification is performed on the bitlines of the array or memory in sequence by grounding the wordlines, applying typically 1 volt to each bitline in sequence and sensing the bitline current. If the bitline current is above a predetermined value at least one of the cells connected to the bitline is over-erased and is drawing leakage current. In this case, an over-erase correction pulse is applied to the bitline. The over-erase correction pulse is a pulse of approximately 5 volts applied to the bitline for a predetermined length of time, typically 100 μs.

After application of the over-erase correction pulse to the bitline, the cells on the bitline are over-erase verified again. If the bitline current is still high indicating that an over-erased cell still remains connected to the bitline, another over-erase correction pulse is applied to the bitline. This procedure is repeated, as many times as necessary until the bitline current is reduced to the predetermined value that is lower than the read current. Then, the procedure is performed for the rest of the cells in the first row and following rows until all of the cells in the memory have been erase verified.

By performing the over-erase correction procedure after each erase pulse, the extent to which cells are over-erased is reduced, improving the endurance of cells. Further, because over-erased cells are corrected after each erase pulse, bitline leakage current is reduced during erase verify, thus preventing under-erased cells from existing upon completion of the erase verify procedure.

Although the extent to which cells are over-erased is reduced, thus improving the endurance of cells, because the APDE verify is embedded in the erase-verify loop more APD pulses are given than required because the APDE loop is embedded.

In other schemes the APDE verify loop is separated from the erase verify loop and column leakage can mask an unerased cell.

Therefore, what is needed is an erase scheme in which the erase verify and APDE verify loops are separated and in which column leakage does not mask unerased bits.

SUMMARY OF THE INVENTION

According to the present invention, the foregoing and other objects and advantages are obtained by a method of erasing a flash Electrically-Erasable Programmable Read Only Memory (EEPROM) device that is comprised of a plurality of memory cells.

The plurality of memory cells is erase verified and an erase pulse is applied to the memory cells if there are undererased memory cells and the memory cells are again erase verified. This cycle repeats until all cells verify as erased and a flag is set to NO. The plurality of memory cells is overerase verified and an overerase correction pulse is applied to the bitline to which the overerased memory cell is attached and the flag is set to YES. This cycle repeats until all cells verify as not being overerased. If it is determined after the overerase verification step that the flag is set to YES, the plurality of memory cells is again erase verified and the procedure repeats. If it is determined after the overerase verification step the flag is set to NO, the erase procedure is considered finished.

The described method thus provides a method of erasing flash EEPROM cells that avoids the unnecessary application of APD pulses. As an example, consider the common situation in which there are overerased bits that do not mask undererased bits. In this case, the present invention would require each overerased bit to be successfully APD'd only once. In contrast, using the prior scheme in which the APDE verify is embedded in the erase verify procedure, the same bit may be overerased and subsequently APD'd a number of times during the erase process.

The present invention is better understood upon consideration of the detailed description below, in conjunction with the accompanying drawings. As will become readily apparent to those skilled in the art from the following description, there is shown and described an embodiment of this invention simply by way of illustration of the best mode to carry out the invention. As will be realized, the invention is capable of other embodiments and its several details are capable of modifications in various obvious aspects, all without departing from the scope of the invention. Accordingly, the drawings and detailed description will be regarded as illustrative in nature and not as restrictive.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of an illustrative embodiments when read in conjunction with the accompanying drawings, wherein:

DETAILED DESCRIPTION

Reference is now made in detail to specific embodiments of the present invention that illustrate the best mode presently contemplated by the inventors for practicing the invention. It should be understood that the description of the best mode is merely illustrative and that it should not be taken in a limiting sense.

Figure 1A:
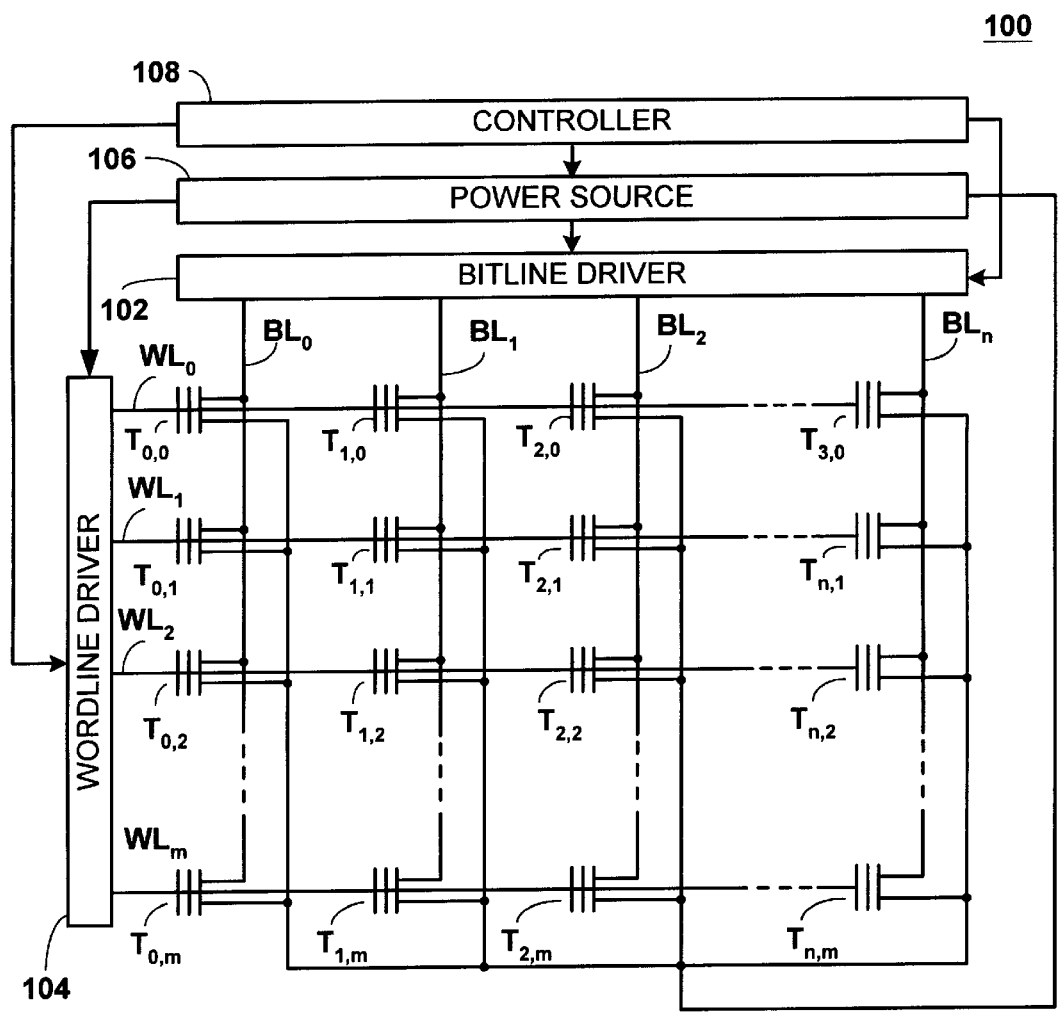
FIG. 1A is a simplified electrical schematic diagram of a flash EEPROM.

FIG. 1A illustrates a basic configuration of a NOR type flash Electrically Erasable Programmable Read-Only Memory (EEPROM) 100 to which the present invention is advantageously applied. The flash memory 100 comprises a plurality of core or memory cells, which are arranged in a rectangular matrix or array of rows and columns. Each row is associated with a wordline (WL), whereas each column is associated with a bitline (BL).

Assuming that there are n columns and m rows, the bitlines are designated as $BL_o$ to $BL_n$ and the wordlines are designated as $WL_o$ to $WL_m$. A bitline driver 102 applies appropriate voltages to the bitlines and a wordline driver 104 applies appropriate voltages to the wordlines. The voltages applied to the drivers 102 and 104 are generated by a power source 106 under the control of a controller 108, which is typically on-chip logic circuitry. The controller 108 also controls the drivers 102 and 104 to address the memory cells individually or collectively as will be described below.

A memory cell is located at each junction of a wordline and a bitline. Each cell includes a Metal-Oxide-Semiconductor (MOS) Field Effect Transistor (FET) having a source and drain formed in a semiconductor substrate, a floating gate, and a control gate separated from the floating gate by a layer of oxide. As should be appreciated, the cells of a flash EEPROM differ from conventional FETs in that they include the floating gate and tunnel oxide layer disposed between the control gate and the semiconductor substrate in which the source and drain are formed.

The cells illustrated in FIG. 1A are designated using the notation $T_{n,m}$, where m is the row (wordline) number and n is the column (bitline) number. The control gates of the cells are connected to respective wordlines, and the drains of the cells are connected to respective bitlines as illustrated. The sources of all of the cells are connected to the power source 106.

Figure 1B:
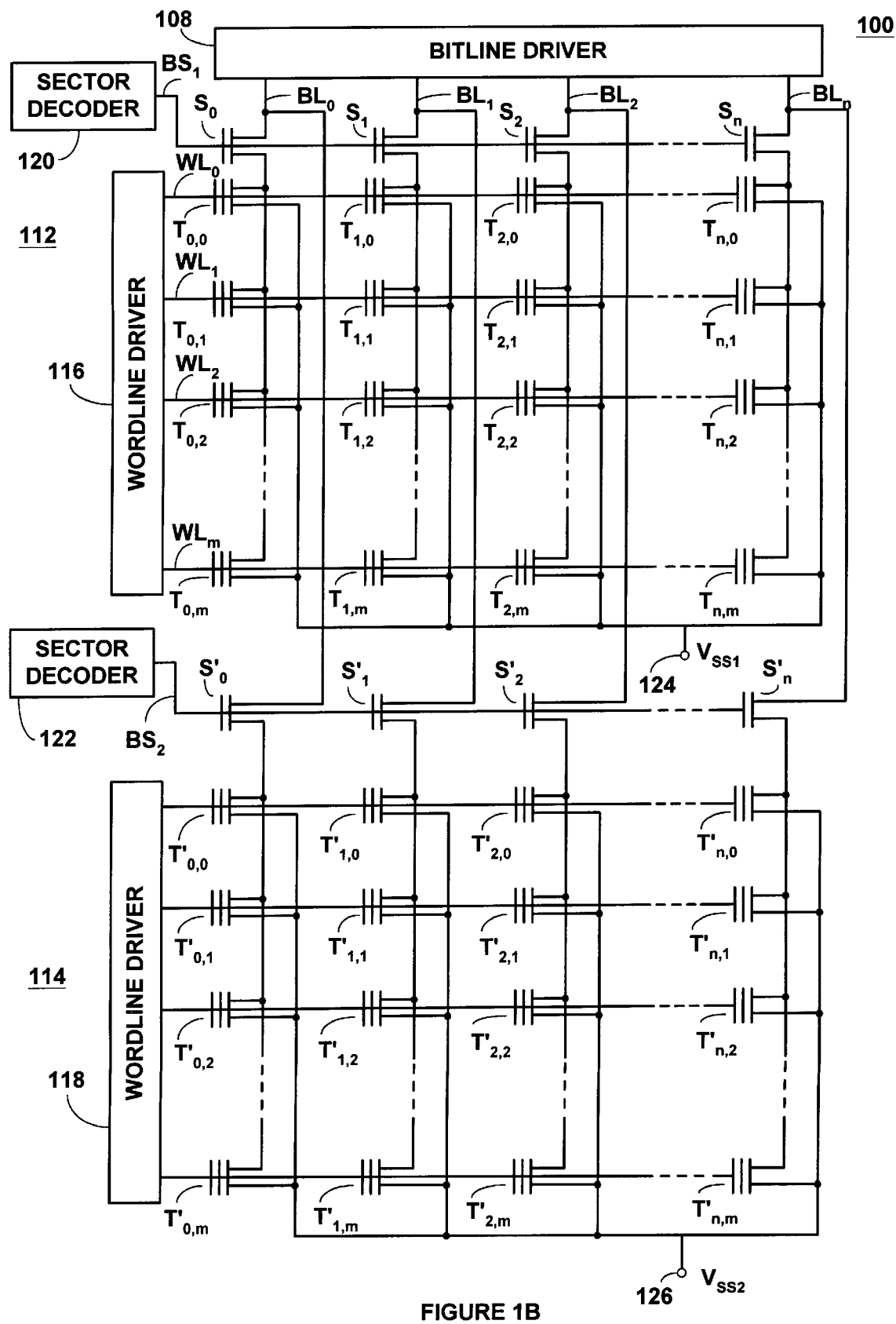
FIG. 1B is similar to FIG. 1A but illustrates a flash EEPROM having cells arranged in two pages of banks.

FIG. 1B illustrates another flash EEPROM memory 110 which is similar to the memory 100 except that the cells are divided into banks, (also known as pages or sectors), two of which are shown in FIG. 1B, each of which can be programmed, erased, and read independently. The memory 110 includes a first cell bank or page 112 and a second cell bank or page 114. The memory cells in the first bank 112 are designated in the same manner as in FIG. 1A, whereas a prime symbol is added to the designations of the cells in the second bank 114. The wordlines of the banks 112 and 114 are connected to separate wordline drivers 116 and 118, respectively.

In addition to the memory cells, each bank 112 and 114 includes a select transistor for each bitline. The select transistors for the banks 112 and 114 are designated as $S_o$ to $S_n$ and $S'_o$ to $S'_n$, respectively. The drains of the select transistors are connected to the respective bitlines, whereas the sources of the select transistors are connected to the drains of the transistors for the wordlines $WL_o$ to $WL_m$ and $WL'_o$ and $WL'_m$.

The select transistors differ from the memory cell transistors in that they are conventional MOSFETs and therefore lack floating gates. The select transistors are switching elements rather than memory elements. The gates of the select transistors for the bank 112 are connected to a bank select output $BS_1$ of a sector decoder 120 and the gates of the select transistors for the bank 114 are connected to a bank select output $BS_2$ of a sector decoder 122.

The sources of the cells in bank 112 are connected to a common source supply voltage $V_{ss1}$ 124 and the sources of the cells in the bank 114 are connected to a common source supply voltage $V_{ss2}$ 126.

The bank 112 is selected by applying a logically high signal to the bank select line $BS_1$ that turns on the transistors $S_o$ to $S_n$ and connects the bitlines $BL_o$ to $BL_n$ to the underlying memory cells. The bank 112 is deselected by applying a logically low signal to the bank select line $BS_1$ that turns off the transistors $S_o$ to $S_n$ and disconnects the memory cells from the bitlines. The bank 114 is selected and deselected in an essentially similar manner using the bank select signal $BS_2$ and select transistors $S'_o$ to $S'_n$. The operation of the memory 110 is essentially similar to that of the memory 100 (FIG. 1A), except that the program, erase and read operations can be performed on the banks 112 & 114 independently.

Figure 2:
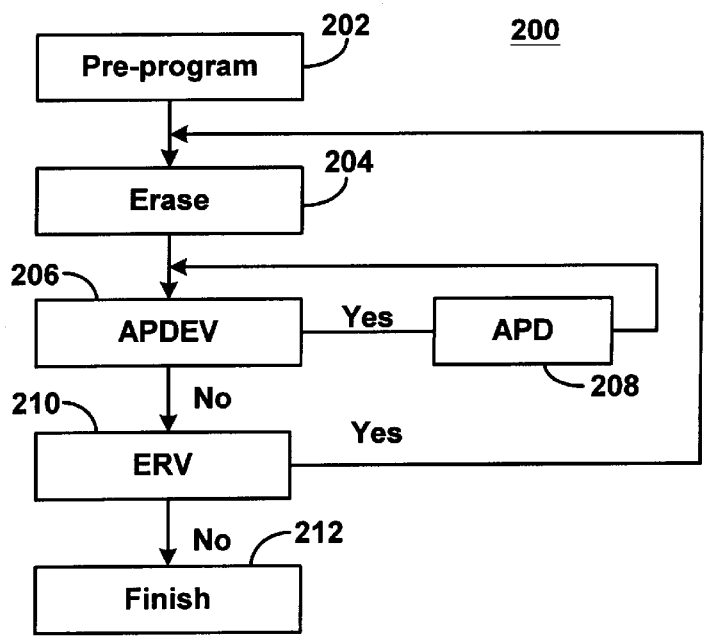
FIG. 2 is the flow diagram of a prior art erase method.

FIG. 2 is a flow diagram of a prior art erase method 200. The prior art erase method 200 begins by a pre-programming step 202 in which all the cells in the memory device or in the bank to be erased are programmed to approximately the same charge level. The purpose of this is to avoid having some cells that were either not programmed or that may have lost charge during normal operations to be substantially overerased during the erase procedure. It should be remembered that all the cells either in a bank or in the entire device are erased as a block and therefore all cells would receive the same erase pulse regardless of their individual charge state. All of the cells that are to be erased are given an erase pulse at 204. As discussed above, a cell can be erased in several ways. In one arrangement, applying a relatively high voltage, typically 12 volts, to the source, grounding the control gate and allowing the drain to float erases a cell. This causes the electrons that were injected into the floating gate during programming to undergo Fowler-Nordheim tunneling from the floating gate through the thin tunnel oxide layer to the source. In another arrangement, applying a negative voltage on the order of minus 10 volts to the control gate, applying 5 volts to the source and allowing the drain to float can also erase a cell. In a further arrangement, applying 5 volts to the P-well and minus 10 volts to the control gate while allowing the source and drain to float erases a cell.

After the erase pulse is applied at 204 an over-erase correction operation is performed starting with an over-erase verification (APDEV) step at 206. The over-erase correction operation is necessary because manufacturing tolerances cause some cells to become over-erased before other cells become erased sufficiently. The overerased cells function as depletion mode transistors that cannot be turned off by normal operating voltages applied to their control gates. The overerased cells functioning as depletion mode transistors introduce leakage current during subsequent program and read operations. The over-erase verification step at 206 determines if an overerase correction operation is required. If an over-erase correction pulse is needed, it is applied at 208. The over-erase correction pulse is approximately 5 volts applied to the bitline to which the overerased cell is attached for a predetermined length of time such as 100 $\mu$s. As can be appreciated, the over-erase correction pulse is applied to all the cells attached to the bitline. The over-erase correction operation of this type is generally known as Automatic Programming Disturb (APD). As discussed above, a method of APD is referred to as Automatic Programming Disturb Erase (APDE) is disclosed in U.S. Pat. No. 5,642,311, entitled "OVERERASE CORRECTION FOR FLASH MEMORY WHICH LIMITS OVERERASE AND PREVENTS ERASE VERIFY ERRORS," issued Jun. 24, 1997 to Lee Cleveland.

After the cells have subjected to an APD pulse at 208 the cells are again over-erase verified at 206 and this cycle repeats until it is verified at 206 that there are no over-erased cells. This cycle repeats bitline by bitline until it is verified at 206 that there are no over-erased cells in the array being erased wherein the cells are erase verified at 210 to determine if there are undererased cells. Determining if there are undererased cells can be accomplished by applying 4 volts to the control gate (wordline), 1 volt to the drain (bitline), grounding the source and using sense amplifiers to sense the bitline current and thereby determine if the threshold voltage of the cell is above a predetermined value. If the threshold voltage of the cell is above the predetermined value, the cell is undererased. If it is determined at 210 that there are undererased cells an erase pulse is applied at 204 to the entire memory array and steps from 206 through 210 are repeated until it is verified at 210 there are no undererased cells at which time the erase procedure is considered finished as indicated at 212.

Figure 3:
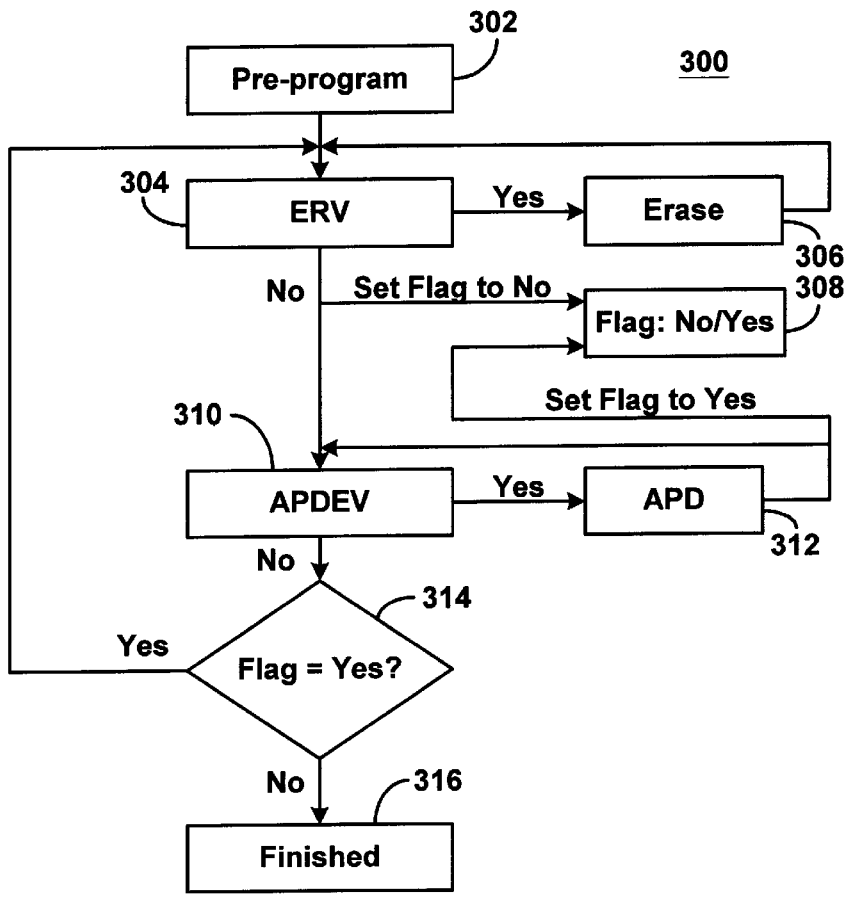
FIG. 3 is the flow diagram of the erase method in accordance with the present invention.

FIG. 3 is the flow diagram of an erase method 300 in accordance with the present invention. The erase method 300 begins by a pre-programming step 302 in which all the cells in the memory device or in the bank to be erased are programmed to approximately the same charge level. The purpose of this is to avoid having some cells that were either not programmed or that may have lost charge during operation to be substantially overerased during the erase procedure. It should be remembered that all the cells either in a bank or in the entire device are erased as a block and therefore all cells would receive the same erase pulse regardless of their individual charge state.

The cells to be erased are erase verified at 304 bitline by bitline to determine if there are undererased cells. Determining if there are undererased cells can be accomplished by applying 4 volts to the control gate (wordline), 1 volt to the drain (bitline), grounding the source and using sense amplifiers to sense the bitline current to determine if the threshold voltage of the cell is above a predetermined value. If the threshold voltage of the cell is above the predetermined value, the cell is undererased. If it is determined at 304 that there are undererased cells in the memory array an erase pulse is applied at 306 to the entire memory array and the steps at 304 and 306 are repeated until it is verified at 304 there are no undererased cells in the memory array.

When it is verified at 304 that there are no undererased cells in the memory array a flag is set to NO as indicated at 308 and an over-erase correction operation is performed starting with an over-erase verification (APDEV) step at 310. The over-erase correction operation is necessary because manufacturing tolerances cause some cells to become over-erased before other cells become erased sufficiently. The overerased cells function as depletion mode transistors that cannot be turned off by normal operating voltages applied to their control gates. The overerased cells functioning as depletion mode transistors introduce leakage current during subsequent program and read operations. The over-erase verification step at 310 determines if an overerase correction operation is required. If an over-erase correction pulse is needed, it is applied at 312 and the flag at 308 is set to YES. The over-erase verification step at 310 determines if another overerase correction operation is required and if another overerase correction operation is required the steps at 312 and 310 are repeated until it is verified at 310 that there are no overerased cells.

When it is verified at 310 that there are no overerased cells, it is determined at 314 if the flag at 308 is set at YES. If the flag is set at YES, which indicates that over-erase correction pulses have been applied, the flow is returned to 304 and the procedure described above repeats. If the flag is set at NO, the erase procedure is considered finished as indicated at 316.

In summary, the present invention overcomes the limitations of the prior art and fulfills the need for a method of erasing flash EEPROM cells that avoids the unnecessary application of APD pulses. Considering the common situation in which there are overerased bits that do not mask undererased bits, the present invention would require each overerased bit to be successfully APD'd only once. In contrast, the prior scheme are in which the APDE verify is embedded in the erase verify, the same bit may be overerased and subsequently APD'd a number of times during erase.

The foregoing description of the embodiment of the invention has been presented for purposes of illustration and description. It is not intended to be exhaustive or to limit the invention to the precise form disclosed. Obvious modifications or variations are possible in light of the above teachings. The embodiment was chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A method of erasing a flash Electrically-Erasable Programmable Read Only Memory (EEPROM) that includes a plurality of memory cells, the method comprising:

(a) verifying the erase of the plurality of memory cells to determine if there are undererased memory cells in the plurality of memory cells;

(b) applying an erase pulse to the plurality of memory cells if there are undererased memory cells in the plurality of memory cells;

(c) repeating steps (a) and (b) until all of the plurality of memory cells verify as erased;

(d) setting a flag to NO when all of the plurality of memory cells verify as erased;

(e) overerase verifying the plurality of memory cells to determine if there are overerased memory cells in the plurality of memory cells;

(f) applying an overerase correction pulse to a bitline to which an overerased memory cell is attached;

(g) setting the flag to YES when an overerase correction pulse is applied to a bitline;

(h) repeating steps (e) through (g) until all of the plurality of memory cells verify as not being overerased; and (i) determining if the flag is set to YES.

2. The method of claim 1 further comprising (j) considering the erase procedure finished if it is determined at (i) that the flag is not set to YES.

3. The method of claim 2 further comprising (k) repeating steps (a) through (i) if it is determined at (i) that the flag is set to YES.

* * * * *